(12) United States Patent
Mitchell, Jr. et al.

(10) Patent No.: US 9,397,935 B1
(45) Date of Patent: Jul. 19, 2016

(54) STAGED SIGNAL MODIFICATION

(71) Applicant: Sprint Communications Company L.P., Overland Park, KS (US)

(72) Inventors: Eugene S. Mitchell, Jr., Blue Springs, MO (US); Nicholas David Caola Kullman, Kansas City, MO (US); Sreekar Marupaduga, Jr., Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 77 days.

(21) Appl. No.: 13/951,092

(22) Filed: Jul. 25, 2013

(51) Int. Cl.
  *H04W 4/00* (2009.01)
  *H04L 12/721* (2013.01)
  *H04B 3/48* (2015.01)
  *H04L 12/26* (2006.01)
  *H04B 3/46* (2015.01)

(52) U.S. Cl.
  CPC ........ *H04L 45/70* (2013.01); *H04B 3/48* (2013.01); *H04B 3/46* (2013.01); *H04L 43/08* (2013.01)

(58) Field of Classification Search
  CPC .................. H04L 45/70; H04L 43/08
  USPC ............................................. 370/252
  See application file for complete search history.

(56) References Cited

U.S. PATENT DOCUMENTS

| | | | |
|---|---|---|---|
| 5,689,814 A * | 11/1997 | Hagisawa et al. ............. 455/69 |
| 2006/0026650 A1 * | 2/2006 | Kim .................. H04B 1/3877 725/62 |
| 2009/0124227 A1 * | 5/2009 | Ishiguro .................. 455/249.1 |
| 2009/0167291 A1 * | 7/2009 | Richeson et al. ............. 324/107 |
| 2009/0280766 A1 * | 11/2009 | Rofougaran et al. ......... 455/296 |
| 2012/0057621 A1 * | 3/2012 | Hong et al. .................. 375/219 |
| 2013/0165057 A1 * | 6/2013 | Lee ..................... H04B 1/0483 455/83 |
| 2014/0105043 A1 * | 4/2014 | Reves Balleste et al. ..... 370/252 |
| 2014/0112422 A1 * | 4/2014 | Zhang ................ H04B 7/0865 375/349 |

* cited by examiner

*Primary Examiner* — Farah Faroul

(57) ABSTRACT

Systems, methods, and computer-readable media for modifying signals are provided. Embodiments include staged low noise amplifiers (LNA's) in order to customize signal modification. Signals may be modified at various fixed gains by different LNA's within a device. Additionally, signals may be attenuated or receive no modification at all in order to ensure signals are within a preferred signal range.

19 Claims, 5 Drawing Sheets

STAGED SIGNAL MODIFICATION

BRIEF SUMMARY

A high-level overview of various aspects of the invention are provided here for that reason, to provide an overview of the disclosure, and to introduce a selection of concepts that are further described in the detailed-description section below. This summary is not intended to identify key features or essential features of the claimed subject matter, nor is it intended to be used as an aid in isolation to determine the scope of the claimed subject matter.

In brief, and at a high level, this disclosure describes, among other things, staged modification of telecommunications signals. Utilizing embodiments hereof, signals may be modified such that they are in a preferred range. In particular, weak signals (i.e., signals that are below a predetermined threshold) may be strengthened to reduce the likelihood of a loss of signal. Furthermore, strong signals (i.e., signals that are above a predetermined threshold) may be attenuated such that they do not dwarf signals associated with a lesser signal value or may, alternatively, bypass any modifications.

BRIEF DESCRIPTION OF THE DRAWINGS

Illustrative embodiments of the present invention are described in detail below with reference to the attached drawing figures, and wherein.

DETAILED DESCRIPTION

Figure 1:
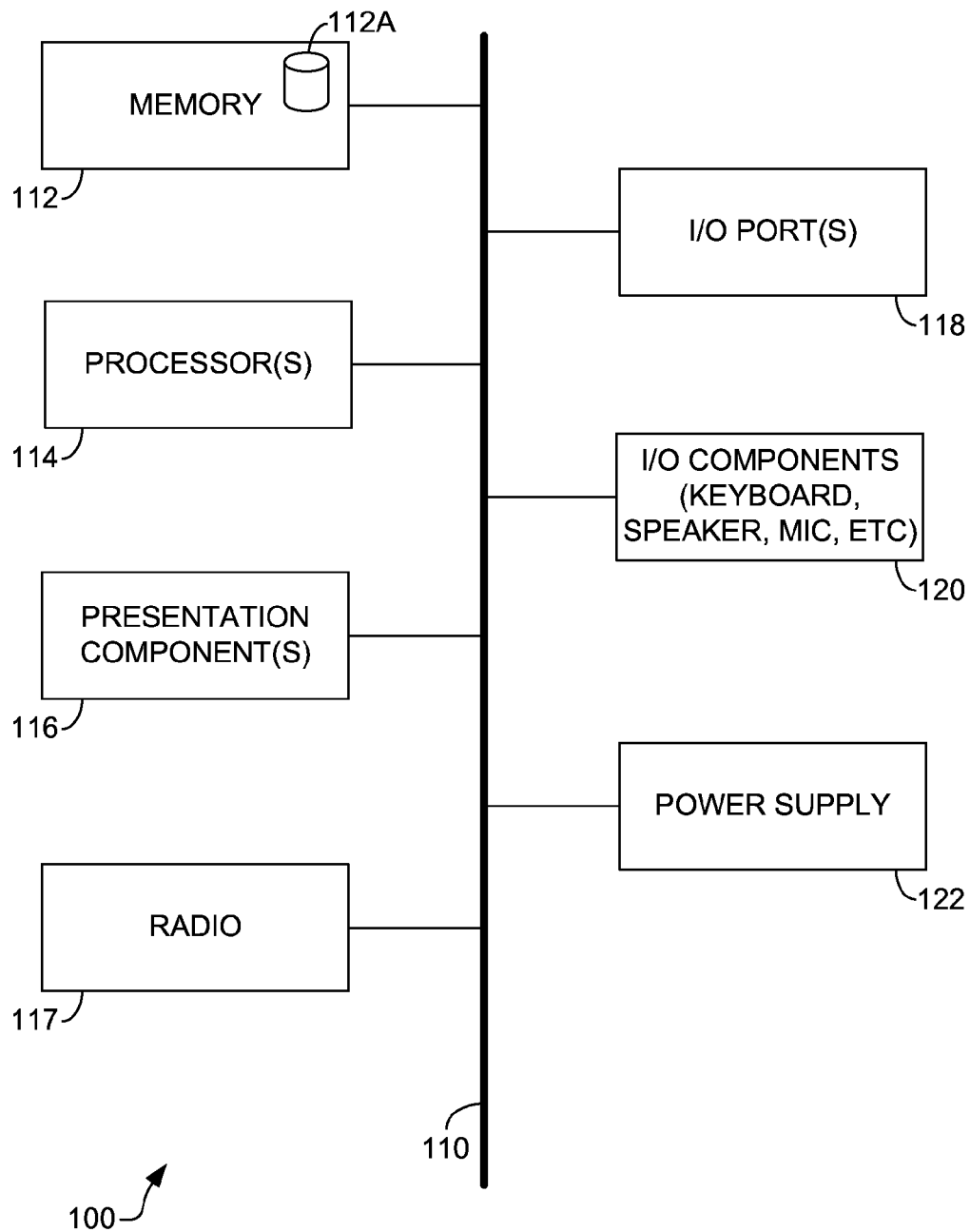
FIG. 1 depicts an exemplary computing device according to embodiments of the present invention.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of the methods employed, the terms should not be interpreted as implying any particular order among or between various steps herein disclosed unless and except when the order of individual steps is explicitly described.

Embodiments of the present invention may be embodied as, among other things, a method, a system, or set of instructions embodied on one or more computer-readable media. As mentioned, embodiments of the present invention are directed toward modifying signals. Utilizing embodiments hereof, staged low noise amplifiers (LNA's) may be used to modify signals such that signals are within a preferred range.

LNA's are typically used in telecommunications networks to accommodate for weak uplink signals, typically arising from users located near a cell edge (e.g., near a perimeter of a coverage area). However, LNA's are currently used for each signal in a telecommunications network, not just weak signals. Thus, signals received that are closer to a base station receiver may overpower, or dwarf, those received from a cell edge.

Additionally, not all signals are associated with the same starting signal value. As such, one signal that may be amplified and not necessary be a weak signal may still fall within a preferred signal range while another signal that is not necessarily a weak signal may be amplified and exceed the preferred signal range. As a result, as previously explained, some signals may be amplified such that they dwarf other signals. The present invention seeks to avoid this problem as not all signals will be amplified. Additionally, signals may be amplified at varying levels of amplification such that two signals may receive differing amplifying values to fall within the same preferred signal range.

Accordingly, in one aspect, the present invention is directed to one or more computer-readable storage media having computer-executable instructions embodied thereon that, when executed, perform a method for modifying signals. The method includes receiving a signal in a telecommunications network, identifying a signal value associated with the signal, comparing the signal value to a predetermined signal level, upon determining the signal value is above the predetermined signal level, routing the signal to a first path, and upon determining the signal value is below the predetermined signal level, routing the signal to a second path.

In another aspect, embodiments of the present invention are directed to one or more computer-readable storage media having computer-executable instructions embodied thereon that, when executed, perform a method for modifying signals. The method includes receiving a signal from a user device, identifying a signal value associated with the signal, comparing the signal value to a predetermined signal level, determining the signal value is below the predetermined signal level, amplifying the signal a first time, identifying a second signal value associated with the signal, determining the second signal value is below the predetermined signal level, and amplifying the signal a second time such that the signal is within a predetermined range.

In yet another aspect, a system for modifying signals is provided. The system includes a computing device associated with one or more processors and one or more computer storage media and a routing device comprising an identifying component to identify a signal value associated with each signal received at the routing device and a routing component to route signals to at least one of a plurality of low noise amplifiers, an attenuator, or a bypass component based on the signal value.

Throughout the description of embodiments of the present invention, several acronyms and shorthand notations are used to aid the understanding of certain concepts pertaining to the associated methods, systems, and computer-readable media. These acronyms and shorthand notations are solely intended for the purpose of providing an easy methodology of communicating the ideas expressed herein and are in no way meant to limit the scope of the present invention. The following is a list of these acronyms:

3G Third Generation Mobile Telecommunications
4G Fourth Generation Mobile Telecommunications
CD-ROM Compact Disk Read Only Memory
CDMA Code Division Multiple Access
GPRS General Packet Radio Service GSM Global System for Mobile communications: originally from Groupe Spécial Mobile
DVD Digital Versatile Discs
EEPROM Electrically Erasable Programmable Read Only Memory
HARQ Hybrid Automatic Repeat Request
HLR Home Location Register
HSDPA High-Speed Downlink Packet Access
LTE Long Term Evolution
PC Personal Computer
PDA Personal Digital Assistant
RAM Random Access Memory
ROM Read Only Memory
TDMA Time Division Multiple Access
UMTS Universal Mobile Telecommunications System
VOIP Voice Over Internet Protocol
VoLTE Voice Over LTE
WiMAX Worldwide Interoperability for Microwave Access Further, various technical terms are used throughout this description. An illustrative resource that fleshes out various aspects of these terms can be found in Newton's Telecom Dictionary, 25th Edition (2009).

Embodiments of the technology may take the form of, among other things: a method, system, or set of instructions embodied on one or more computer-readable media. Computer-readable media include both volatile and nonvolatile media, removable and nonremovable media, and contemplate media readable by a database, a switch, and various other network devices. By way of example, and not limitation, computer-readable media comprise media implemented in any method or technology for storing information. Examples of stored information include computer-useable instructions, data structures, program modules, and other data representations. Media examples include, but are not limited to information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently.

Referring to the drawings in general, and initially to FIG. 1 in particular, a block diagram of an illustrative communications device according to one embodiment is provided and referenced generally by the numeral 100. Although some components are shown in the singular, they may be plural. For example, communications device 100 might include multiple processors or multiple radios, etc. As illustratively shown, communications device 100 includes a bus 110 that directly or indirectly couples various components together including memory 112, a processor 114, a presentation component 116, a radio 117 (if applicable), input/output ports 118, input/output components 120, and a power supply 122.

Memory 112 might take the form of memory components previously described. Thus, further elaboration will not be provided here, only to say that memory component 112 can include any type of medium that is capable of storing information (e.g., a database). A database can be any collection of records. In one embodiment, memory 112 includes a set of embodied computer-executable instructions 113 that, when executed, facilitate various aspects disclosed herein. These embodied instructions will variously be referred to as "instructions" or an "application" for short.

Processor 114 might actually be multiple processors that receive instructions and process them accordingly. Presentation component 116 includes the likes of a display, a speaker, as well as other components that can present information (such as a lamp (LED), or even lighted keyboards).

Numeral 117 represents a radio(s) that facilitates communication with a wireless-telecommunications network. Illustrative wireless telecommunications technologies include CDMA, GPRS, TDMA, GSM, and the like. Radio 117 might additionally or alternatively facilitate other types of wireless communications including Wi-Fi, WiMAX, LTE, or other VoIP communications. As can be appreciated, in various embodiments, radio 117 can be configured to support multiple technologies and/or multiple radios can be utilized to support multiple technologies.

Input/output port 118 might take on a variety of forms. Illustrative input/output ports include a USB jack, stereo jack, infrared port, proprietary communications ports, and the like. Input/output components 120 include items such as keyboards, microphones, speakers, touch screens, and any other item usable to directly or indirectly input data into communications device 100. Power supply 122 includes items such as batteries, fuel cells, or any other component that can act as a power source to power communications device 100.

As previously mentioned, embodiments of the present invention provide systems, methods, and computer-readable media for modifying signals. Utilizing embodiments hereof, staged low noise amplifiers (LNA's) may be used to modify signals such that signals are within a preferred range. LNA's are typically used in telecommunications networks to accommodate for weak uplink signals, typically arising from users located near a cell edge (e.g., near a perimeter of a coverage area). However, LNA's are currently used for each signal in a telecommunications network, not just weak signals. Thus, signals received that are closer to a base station receiver may overpower, or dwarf, those received from a cell edge.

Additionally, not all signals are associated with the same starting signal value. As such, one signal that may be amplified and not necessary be a weak signal may still fall within a preferred signal range while another signal that is not necessarily a weak signal may be amplified and exceed the preferred signal range. As a result, as previously explained, some signals may be amplified such that they dwarf other signals. The present invention seeks to avoid this problem as not all signals will be amplified. Additionally, signals may be amplified at varying levels of amplification such that two signals may receive differing amplifying values to fall within the same preferred signal range.

The present invention provides staged LNA's in order to overcome these issues. Staged LNA's may be utilized to amplify some uplink signals while ignoring others. In particular, the staged LNA's may apply various amplifications, if any, to uplink signals based on a signal value of the uplink signal. As will be described in detail below, strong uplink signals may travel a different path through a network than weak uplink signals (where strength is based on a predefined signal value threshold). Paths may vary according to a signal value associated with a signal. In brief, signals associated with a signal value above a predetermined threshold may bypass the LNA(s) while signals associated with a signal below a predetermined threshold may be amplified at varying amplifications. Additionally, signals associated with a signal value above a predetermined threshold may be attenuated such that the signal value is decreased.

Figure 2:
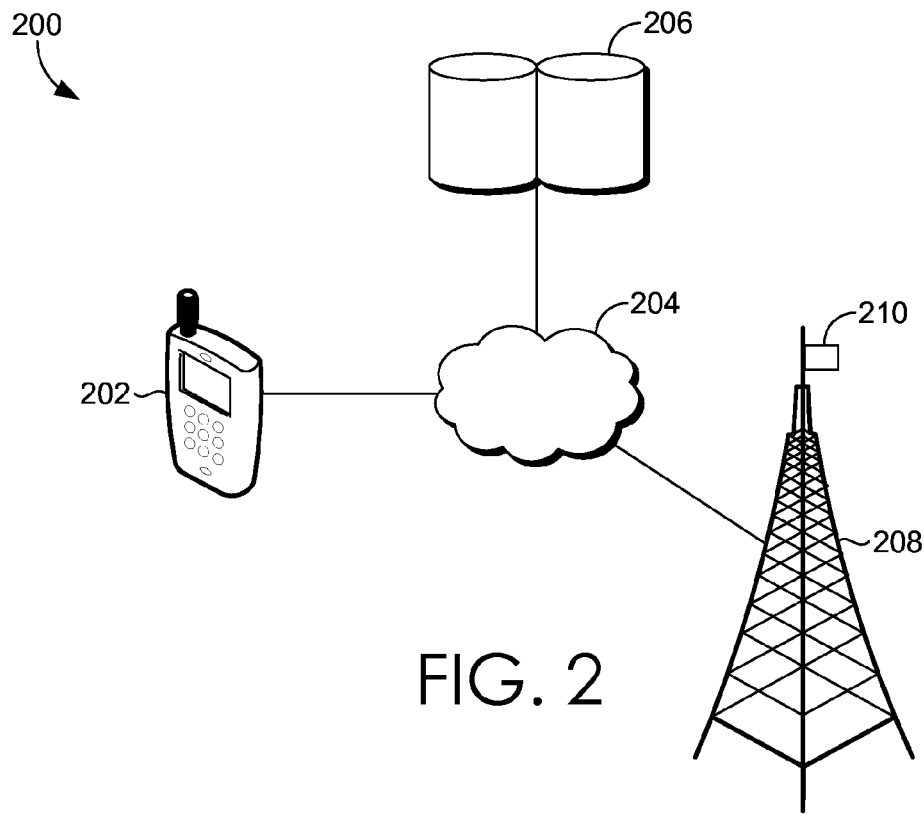
FIG. 2 depicts an illustrative operating system for carrying out embodiments of the present invention.

FIG. 2 provides an exemplary network environment suitable for use in implementing embodiments of the present invention. Such a network environment is illustrated and designated generally as network environment 200. Network environment 200 is but one example of a suitable network environment and is not intended to suggest any limitation as to the scope of use or functionality of the invention. Neither should the network environment 200 be interpreted as having any dependency or requirement relating to any one or combination of components illustrated.

In the network environment 200, a user device 202 may communicate with other devices, such as mobile devices, servers, etc. The user device 202 may take on a variety of forms, such as a personal computer (PC), a laptop computer, a tablet, a netbook, a mobile phone, a Smart phone, a personal digital assistant (PDA), or any other device that is cable of communicating with other devices. For example, the user device 202 can take on any form, such as, for example, a mobile device or any other computing device capable of wirelessly communicating with the other devices using a network. Makers of illustrative devices include, for example, Research in Motion, Creative Technologies Corp., Samsung, Apple Computer, and the like. A device can include, for example, a display(s), a power source(s) (e.g., a battery), a data store(s), a speaker(s), memory, a buffer(s), and the like. In embodiments, a user device comprises a wireless or mobile device with which a wireless telecommunication network(s) can be utilized for communication (e.g., voice and/or data communication). In this regard, the user device can be any mobile computing device that communicates by way of, for example, a 3G or 4G network.

The user device 202 can utilize network 204 to communicate with other computing devices (e.g., a mobile device(s), a server(s), a personal computer(s), etc.). In embodiments, the network 204 is a telecommunications network(s), or a portion thereof. A telecommunications network might include an array of devices or components, some of which are not shown so as to not obscure more relevant aspects of the invention. Components such as terminals, links, and nodes (as well as other components) can provide connectivity in some embodiments. Network 204 can include multiple networks, as well as being a network of networks, but is shown in more simple form so as to not obscure other aspects of the present invention. Network 204 can be part of a telecommunications network that connects subscribers to their immediate service provider. In embodiments, the network 204 can be associated with a telecommunications provider that provides services to user devices, such as user device 202. For example, the network 204 may provide voice services to user devices or corresponding users that are registered or subscribed to utilize the services (e.g., the network 204) provided by a telecommunications provider. The network 204 can be any communication network providing voice and/or data service(s), such as, for example, a 1× circuit voice, a 3G network (e.g., CDMA, CDMA2000, WCDMA, GSM, UMTS), or a 4G network (WiMAX, LTE, HSDPA).

The network environment 200 includes a database 206. The database 206 may be similar to the memory component 112 of FIG. 1 and can be any type of medium that is capable of storing information. Database 206 can be any collection of records. In one embodiment, database 206 includes a set of embodied computer-executable instructions that, when executed, facilitate various aspects disclosed herein. These embodied instructions will variously be referred to as "instructions" or an "application" for short.

The network environment 200 also includes a network tower 208 including a routing device 210. The network tower 208 may be an eNodeB of a 4G telecommunications network. The network tower 208 may be any hardware capable of communicating with a user device, such as user device 202. The routing device 210 is further illustrated in FIG. 3 and will be discussed in detail below.

Figure 3:
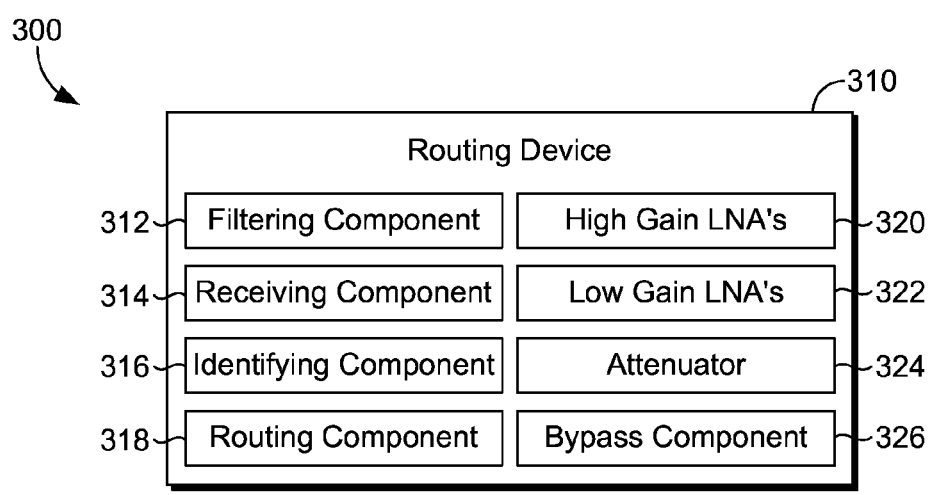
FIG. 3 depicts a component of an illustrative operating system for carrying out embodiments of the present invention.

FIG. 3 provides routing device 310 (which is the same as routing device 210 of FIG. 2). Routing device 310 includes a filtering component 312, a receiving component 314, an identifying component 316, a routing component 318, high gain LNA's 320, low gain LNA's 322, an attenuator 324, and a bypass component 326.

The filtering component 312 may be configured for, among other things, filtering out a frequency band. The filtering component 312 may be, for example, an in-band filter. In an embodiment, the filtering component 312 filters the frequency band in order to eliminate signals that are not associated with the telecommunications network 200.

The receiving component 314 may be configured for, among other things, receiving a signal value associated with a signal. The signal value may be a received signal strength indicator (RSSI) value. Signal values may vary in strength and may be categorized in the present invention as strong signals and weak signals. Strong signals, as used herein, refer generally to signals having a signal value above a predetermined threshold. Weak signals, as used herein, refer generally to signals having a signal value below a predetermined threshold. Signal strength may vary depending on many factors including, but not limited to, location of a user device within a coverage area.

The identifying component 316 may be configured for, among other things, identifying the signal value associated with the received signal. As previously mentioned, the signal value may be designated as a strong signal value or a weak signal value based on the relationship of the signal value to a predetermined threshold.

The routing component 318 may be configured for, among other things, routing signals to appropriate components of the routing device 310. The routing component 318 may route weak signals to Path A, for example, strong signals to Path B, and additional signals to Path C. In embodiments, the various paths are associated with attenuators, LNA's of varying strength, and bypass components. Specifically, the routing component 318 may route a weak signal (i.e., a signal associated with a signal value below a predetermined threshold) to one of a plurality of LNA's. The plurality of LNA's may include multiple LNA's associated with differing amplifications. For instance, a first LNA may amplify a signal a first amount while a second LNA may amplify a signal a second amount, different from the first amount. The LNA to which the signal is routed may be determined based on the identified signal value of the signal and a preferred signal range of the system 200. For instance, a signal that is associated with a signal value that is further from the preferred signal range may be sent to an LNA that will amplify the signal much more than another LNA.

The high gain LNA's 320 may be configured for, among other things, amplifying signals. The high gain LNA's 320 are referred to as "high gain" as they amplify a signal with a value over a predetermined amplification threshold. High gain LNA's 320 may receive signals to amplify that are not close to a preferred signal range such that a high amplification (from the high gain LNA) is needed in order to reach the preferred signal range. In an embodiment, high gain LNA's may be associated with a gain of 12 dB.

The low gain LNA's 322 may be configured for, among other things, amplifying signals. The amplification associated with low gain LNA's is lower than the amplification associated with high gain LNA's. Incorporating both high gain and low gain LNA's into the routing device 300 allows the system to amplify signals with different amplifications or stage amplifications. Thus, depending on a starting signal value for a signal, the amplification required may be higher or lower in order to achieve the preferred signal range. Low gain LNA's may be associated with intermediate gains less than 12 dB. For example, a first low gain LNA may be associated with a gain of 9 dB while a second gain LNA may be associated with a gain of 6 dB. As signals may be amplified with varying levels of amplification (e.g., 6 dB, 9 dB, etc.), a signal may need to be amplified more than once, and by different LNA's, in order to achieve a signal within the preferred signal range. As such, once a signal is amplified, the identifying component 316 may identify an updated signal in order to identify remaining amplifications that may be needed. The routing component 318 may then route the recently-amplified signal to the high gain LNA 320, the low gain LNA 322, the attenuator 324, or the bypass component 326 depending on the remaining amplifications needed. In embodiments, the routing component 318 is configured to route signals such that the fewest number of modifications necessary are performed on the signal.

The attenuator 324 may be configured for, among other things, attenuating signals. Signals associated with, for example, a signal value above a predetermined threshold may be attenuated (lessened) in order to avoid dwarfing lesser signals. Additionally, the signal may be attenuated in order to fall within a preferred signal range (if the signal was outside/above the preferred signal range before attenuation).

Alternatively, signals associated with a signal value above a predetermined threshold may be routed to the bypass component 326. The bypass component 326 may be configured for, among other things, bypassing signals through the routing device 300 such that they are not amplified or attenuated (i.e., the signal receives a modification of 0 dB). This may be desired when a signal is already within a preferred signal range. In embodiments, a preferred signal range may be between −70 to −80 dB.

Figure 4:
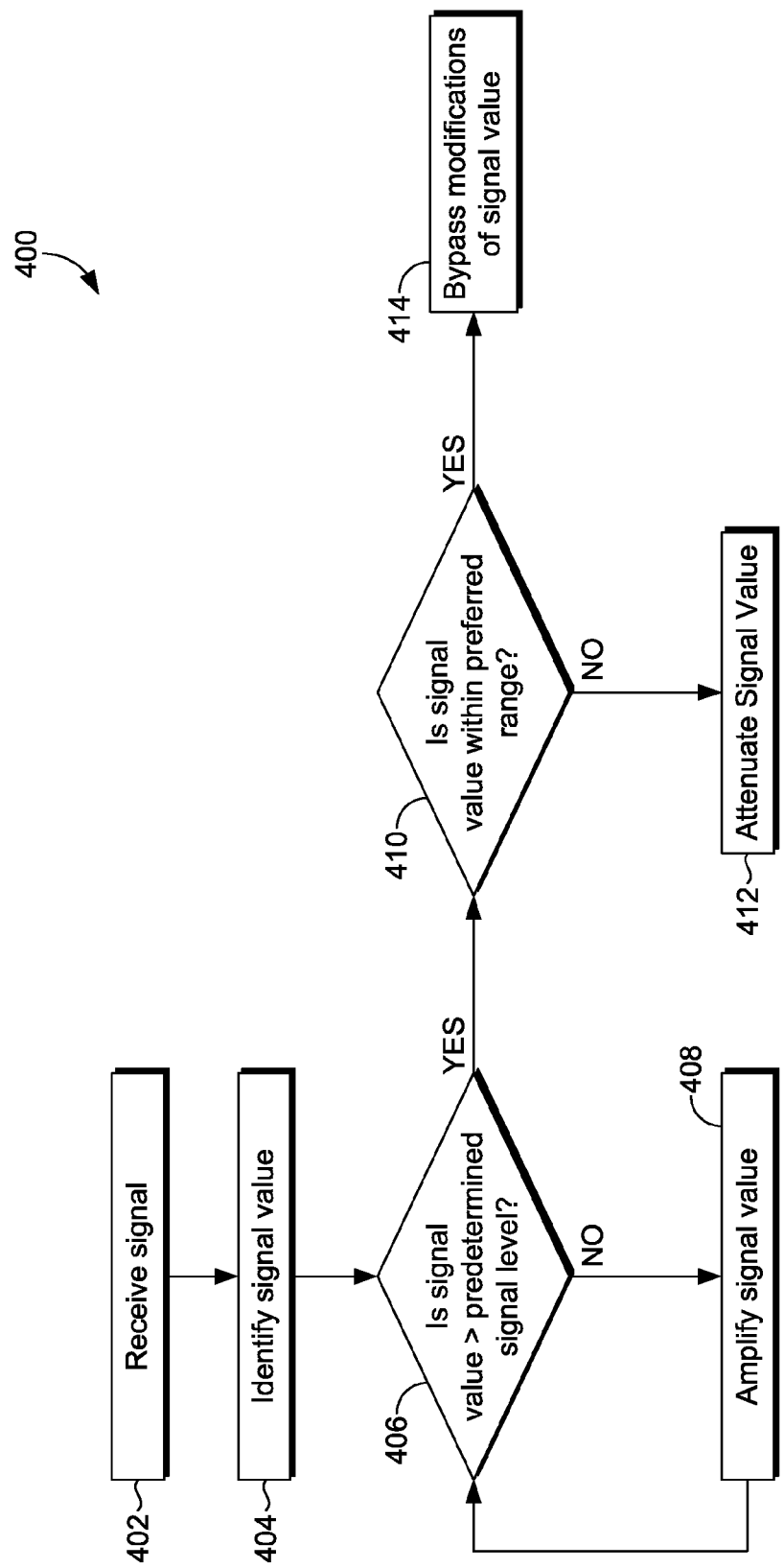
FIG. 4 depicts a flow diagram illustrating a method of modifying signals, in accordance with an embodiment of the present invention.

FIG. 4 provides a specific embodiment of a method 400 for modifying signals. At block 402 a signal is received and the signal value associated with the signal is identified at block 404. At block 406, a determination is made as to whether the signal value is greater than a predetermined signal threshold/level. Upon determining that the signal value is not greater than the predetermined signal threshold, the signal is amplified at block 408. Amplification may occur more than once. As such, the determination at block 406 of whether the signal value is greater than the predetermined signal threshold may be repeated until the answer is 'yes'.

Upon determining the signal value is greater than the predetermined signal threshold, a determination is made a block 410 whether the signal value is within a preferred range. Upon determining the signal value is not within the preferred signal range, the signal is attenuated at block 412. Upon determining the signal value is within the preferred signal range, the signal bypasses modifications at block 414.

Figure 5:
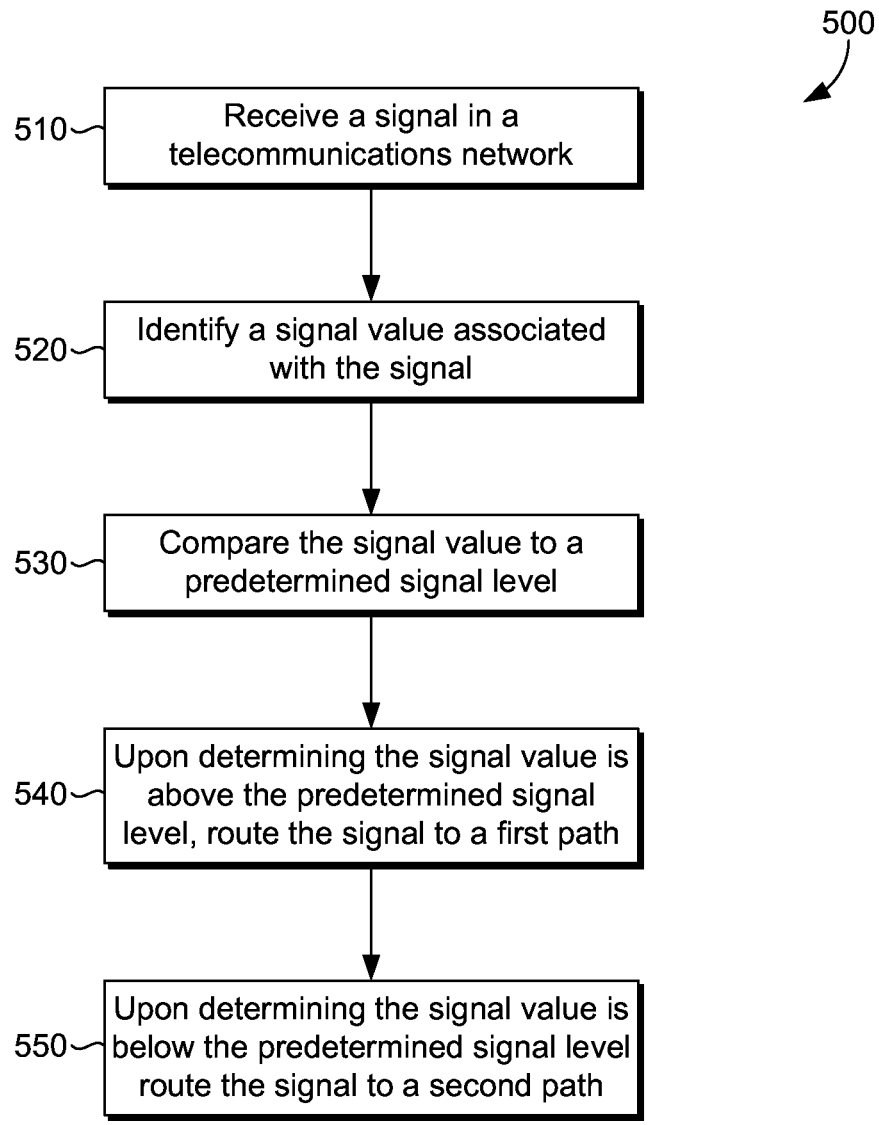
FIG. 5 provides a first exemplary method for modifying signals, in accordance with an embodiment of the present invention.

Turning now to FIG. 5, a flow diagram is shown illustrating a first exemplary method 500 for modifying signals in accordance with an embodiment of the present invention. Initially, at block 510, a signal is received in a telecommunications network. At block 520, a signal value associated with the signal is identified. The signal value may be an RSSI value. At block 530, the signal value is compared to a predetermined signal level. Upon determining the signal value is above the predetermined signal level at block 540, the signal is routed to a first path. The first path may include attenuation or no modifications of the signal. Upon determining the signal value is below the predetermined signal level at block 550, the signal is routed to a second path. The second path may include amplification.

Figure 6:
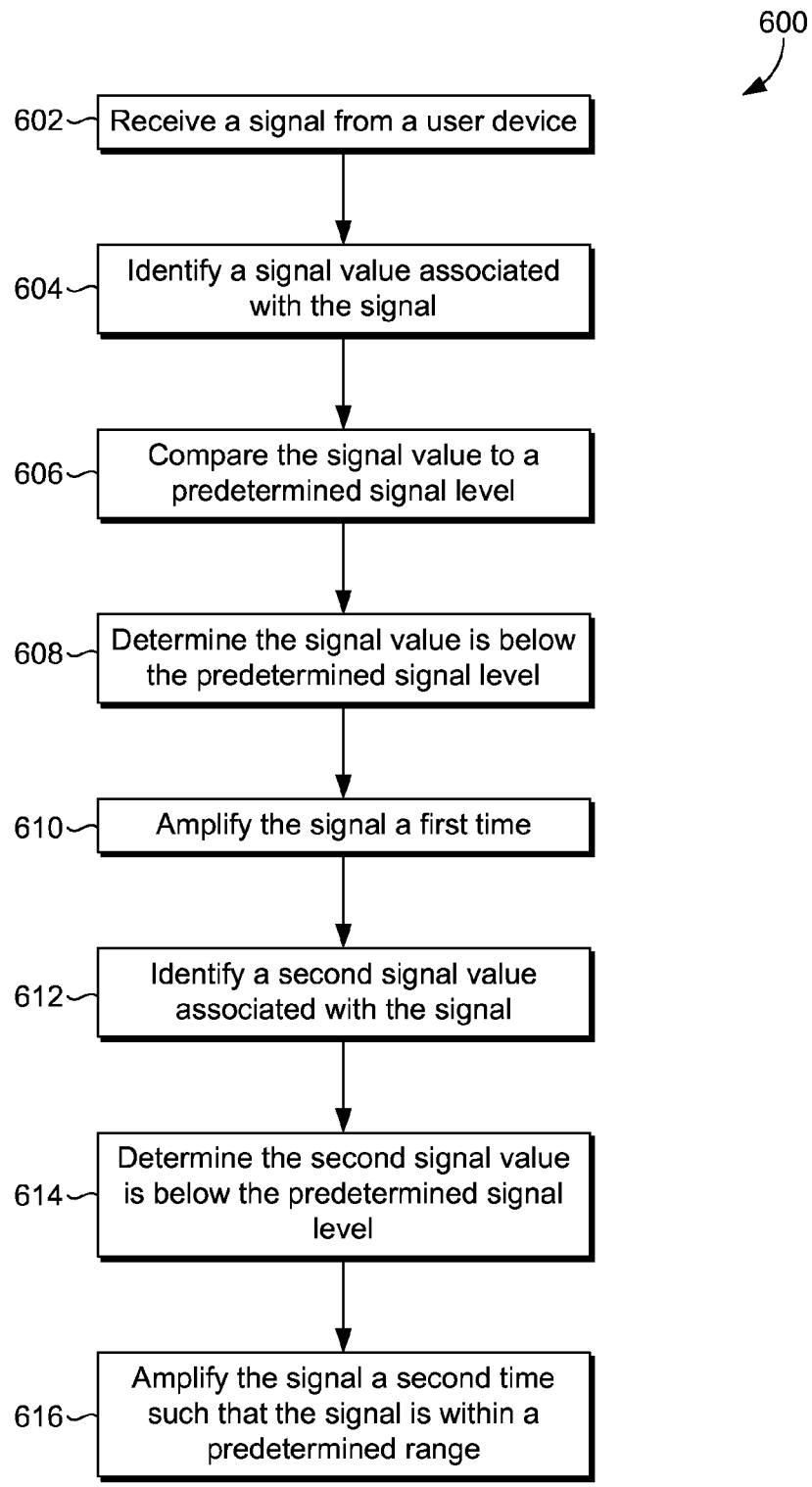
FIG. 6 provides a second exemplary method for modifying signals, in accordance with an embodiment of the present invention.

Turning now to FIG. 6, a flow diagram is shown illustrating a second exemplary method 600 for modifying signals, in accordance with an embodiment of the present invention. At block 602 a signal is received from a user device. A signal value associated with the signal is identified at block 604. The signal value is compared to a predetermined signal level at block 606. At block 608 it is determined that the signal value is below the predetermined signal level. At block 610 the signal is amplified a first time and a second signal value associated with the signal is identified at block 612. At block 614 it is determined that the second signal value is below the predetermined signal level and the signal is amplified a second time at block 616 such that the signal is within a predetermined range. The first and second amplifications of the signal may be the same or different.

It will be understood by those of ordinary skill in the art that the order of steps shown in the methods 400 of FIG. 4, 500 of FIG. 5 and 600 of FIG. 6 is not meant to limit the scope of the present invention in any way and, in fact, the steps may occur in a variety of different sequences within embodiments hereof. Any and all such variations, and any combination thereof, are contemplated to be within the scope of embodiments of the present invention.

Many different arrangements of the various components depicted, as well as components not shown, are possible without departing from the scope of the claims below. Embodiments of our technology have been described with the intent to be illustrative rather than restrictive. Alternative embodiments will become apparent readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims.

What is claimed is:

1. One or more non-transitory computer-readable storage media having computer-executable instructions embodied thereon that, when executed, perform a method for modifying signals, the method comprising:
   receiving a signal in a telecommunications network;
   identifying a signal value associated with the signal;
   comparing the signal value to a predetermined signal level;
   upon determining the signal value is above the predetermined signal level, routing the signal to a first path, wherein the first path bypasses amplification of the signal;
   upon determining the signal value is below the predetermined signal level, routing the signal to a second path associated with at least one low noise amplifier; and
   when the signal value is subsequently determined to be below the predetermined signal level, routing the signal to the second path a second time.

2. The media of claim 1, wherein the signal is received by a device including a plurality of low noise amplifiers.

3. The media of claim 1, wherein the first path attenuates the signal.

4. The media of claim 1, wherein the second path amplifies the signal.

5. The media of claim 1, further comprising filtering a signal stream including a plurality of signals from a plurality of user devices, wherein the signal stream only retains signals associated with the telecommunications network.

6. The media of claim 1, wherein each of the first and second path result in a signal between −70 and −80 dB.

7. One or more non-transitory computer-readable storage media having computer-executable instructions embodied thereon that, when executed, perform a method for modifying signals, the method comprising:
  receiving a signal from a user device;
  identifying a signal value associated with the signal;
  comparing the signal value to a predetermined signal level;
  determining the signal value is below the predetermined signal level;
  amplifying the signal a first time via a low noise amplifier;
  identifying a second signal value associated with the signal;
  determining the second signal value is below the predetermined signal level; and
  amplifying the signal a second time, wherein as amplified a second time, the signal is within a predetermined range.

8. The media of claim 7, wherein the predetermined range is −70 to −80 dB.

9. The media of claim 7, wherein each amplification is associated with a predetermined fixed gain.

10. The media of claim 7, further comprising receiving a second signal and determining the second signal is above the predetermined signal level.

11. The media of claim 10, wherein the second signal is routed to bypass modification of the second signal.

12. The media of claim 11, wherein the second signal is routed, and as routed, a signal value of the second signal is attenuated.

13. The media of claim 7, wherein amplifying the signal a second time further includes another low noise amplifier having a strength that is not the same as the low noise amplifier.

14. A system for modifying signals, the system comprising:
  a computing device associated with one or more processors and one or more computer storage media; and
  a routing device comprising:
    an identifying component configured to identify a signal value associated with each signal received at the routing device; and
    a routing component configured to:
      route signals to an attenuator, a bypass component, or at least one of a plurality of low noise amplifiers based on the signal value; and
      when a signal value of an amplified signal routed to at least one of the plurality of low noise amplifiers is determined to be below a predetermined signal level, routing the amplified signal a second time to at least one of the plurality of low noise amplifiers.

15. The system of claim 14, further comprising a filtering component configured to filter a signal stream including a plurality of signals from a plurality of user devices such that only signals associated with an identified telecommunications network are retained.

16. The system of claim 15, wherein each of the plurality of low noise amplifiers is associated with various predetermined fixed gains.

17. The system of claim 16, wherein the system routes signal values identified as below a predetermined signal value to a first low noise amplifier associated with a predetermined fixed gain that is greater than the predetermined fixed gain associated with a second low noise amplifier.

18. The system of claim 17, wherein the system routes signal values identified as above a predetermined signal value to a bypass component configured to bypass modification to the signal values.

19. The system of claim 17, wherein the system routes signal values identified as above a predetermined signal to an attenuator configured to reduce the strength of the signal value.

* * * * *